United States Patent
Ishizuka et al.

(10) Patent No.: US 8,697,544 B2
(45) Date of Patent: Apr. 15, 2014

(54) METHOD FOR MANUFACTURING BONDED WAFER

(75) Inventors: Tohru Ishizuka, Annaka (JP); Norihiro Kobayashi, Annaka (JP); Nobuhiko Noto, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 221 days.

(21) Appl. No.: 13/126,993

(22) PCT Filed: Oct. 14, 2009

(86) PCT No.: PCT/JP2009/005346
§ 371 (c)(1),
(2), (4) Date: Apr. 29, 2011

(87) PCT Pub. No.: WO2010/064355
PCT Pub. Date: Jun. 10, 2010

(65) Prior Publication Data
US 2011/0212598 A1 Sep. 1, 2011

(30) Foreign Application Priority Data
Dec. 4, 2008 (JP) .................................. 2008-309524

(51) Int. Cl.
*H01L 21/30* (2006.01)
(52) U.S. Cl.
USPC .................................. 438/458; 257/E21.568
(58) Field of Classification Search
USPC ........... 257/303, E21.122, E21.568; 438/139, 438/455, 458, 691, 770
See application file for complete search history.

(56) References Cited

U.S. PATENT DOCUMENTS

| | | | |
|---|---|---|---|
| 5,374,564 A | 12/1994 | Bruel | |
| 6,534,380 B1 * | 3/2003 | Yamauchi et al. | 438/455 |

(Continued)

FOREIGN PATENT DOCUMENTS

| | | |
|---|---|---|
| CN | 1479353 A | 3/2004 |
| CN | 1737994 A | 2/2006 |

(Continued)

OTHER PUBLICATIONS

International Search Report issued in corresponding International Patent Application No. PCT/JP2009/005346 dated Dec. 28, 2009.

(Continued)

*Primary Examiner* — Trung Q Dang
(74) *Attorney, Agent, or Firm* — Oliff PLC

(57) ABSTRACT

The present invention is a method for manufacturing a bonded wafer including at least the steps of: forming an ion-implanted layer inside a bond wafer; bringing the ion-implanted surface of the bond wafer into close contact with a surface of a base wafer directly or through a silicon oxide film; and performing heat treatment for delaminating the bond wafer at the ion-implanted layer, wherein the heat treatment step for delaminating includes performing a pre-annealing at a temperature of less than 500° C. and thereafter performing a delamination heat treatment at a temperature of 500° C. or more, and the pre-annealing is performed at least by a heat treatment at a first temperature and a subsequent heat treatment at a second temperature higher than the first temperature. As a result, there is provided a method for manufacturing a bonded wafer having high quality, for example, mainly the reduction of defects, by forming a high bonding strength state at a lower temperature than the temperature at which the delamination is caused, in the manufacture of the bonded wafer by the Smart Cut method (registered trademark).

1 Claim, 1 Drawing Sheet

(56) References Cited

U.S. PATENT DOCUMENTS

| | | | |
|---|---|---|---|
| 6,936,523 B2 * | 8/2005 | Berne et al. | 438/458 |
| 2003/0216008 A1 | 11/2003 | Schwarzenbach et al. | |
| 2004/0152283 A1 | 8/2004 | Tate et al. | |
| 2004/0171232 A1 | 9/2004 | Cayrefourcq et al. | |
| 2005/0101104 A1 | 5/2005 | Schwarzenbach et al. | |
| 2005/0196936 A1 | 9/2005 | Daval et al. | |
| 2006/0040470 A1 | 2/2006 | Ben Mohamed et al. | |
| 2006/0266437 A1 | 11/2006 | Morimoto et al. | |
| 2007/0117229 A1 * | 5/2007 | Schwarzenbach et al. | 438/14 |
| 2008/0237804 A1 | 10/2008 | Bourdelle et al. | |

FOREIGN PATENT DOCUMENTS

| | | |
|---|---|---|
| EP | 1 628 339 A1 | 2/2006 |
| FR | 2 867 307 A1 | 9/2005 |
| FR | 2 914 495 A1 | 10/2008 |
| JP | A-05-211128 | 8/1993 |
| JP | A-09-331077 | 12/1997 |
| JP | A-11-097379 | 4/1999 |
| JP | A-2002-353082 | 12/2002 |
| JP | A-2003-347176 | 12/2003 |
| JP | A-2003-347526 | 12/2003 |
| JP | A-2006-074034 | 3/2006 |
| JP | A-2007-526646 | 9/2007 |
| WO | WO 2005/024916 A1 | 3/2005 |
| WO | WO 2008/120074 A1 | 10/2008 |

OTHER PUBLICATIONS

International Preliminary Report on Patentability issued in International Patent Application No. PCT/JP2009/005346 dated Jul. 5, 2011.

Mar. 26, 2012 Extended Search Report issued in European Patent Application No. 09830126.0.

Aug. 31, 2012 Chinese Office Action issued in Chinese Patent Application No. 200980147233.1 (with partial translation).

May 6, 2013 Decision of Refusal issued in Chinese Application No. 200980147233.1 with partial English-language translation.

Mar. 26, 2013 Notification of Reasons for Refusal issued in Japanese Application No. 2008-309524 with partial English-language translation.

European Office Action issued in European Patent Application No. 09830126.0 on Feb. 5, 2013.

Jul. 19, 2013 Summons to attend Oral Proceedings issued in European Application No. 09830126.0.

* cited by examiner

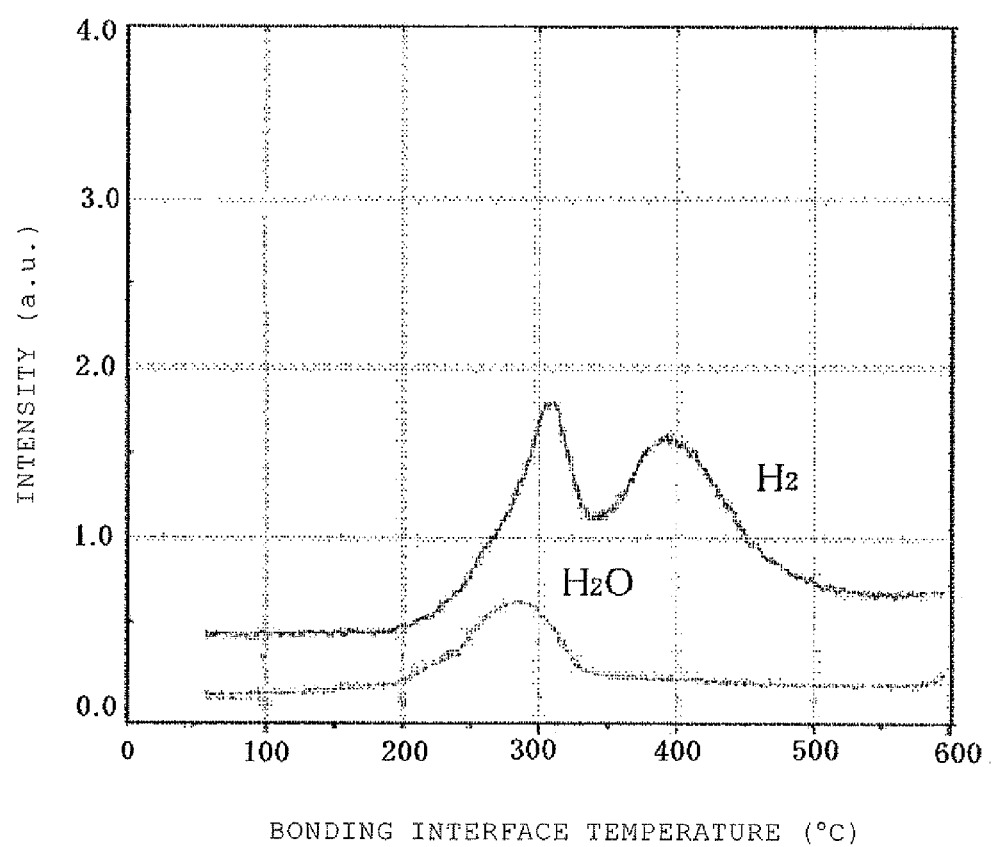

METHOD FOR MANUFACTURING BONDED WAFER

TECHNICAL FIELD

The present invention relates to a method for manufacturing a bonded wafer by using a Smart Cut method (registered trademark), and typically to a method for manufacturing an SOI wafer or a directly bonded wafer by bringing a wafer as a supporting substrate into close contact with a silicon wafer into which hydrogen ions and the like are implanted and thereafter delaminating it.

BACKGROUND ART

As the generation of devices advances, the goal of a higher performance trend cannot be achieved only by a scaling effect with a conventional bulk silicon wafer, and a new device structure is accordingly needed. An SOI wafer has been paid attention to as a starting raw material. The SOI wafer is manufactured by a bonding method (thinning a thickness by grinding and polishing), a SIMOX method, or a Smart Cut method (registered trademark: thinning a thickness by an ion implantation delamination). The SOI wafer has been mainly used which is manufactured by using the Smart Cut method (registered trademark), from the viewpoint of being capable of manufacturing an SOI layer in a wide thickness range in case of the fabrication of a thin SOI layer.

In the Smart Cut method, at least one gas ion of a hydrogen ion and a rare gas ion is implanted into a silicon single crystal bond wafer from a surface thereof to form an ion-implanted layer inside the wafer. Next, the ion-implanted surface of the bond wafer is brought into close contact with a surface of a base wafer directly or through a silicon oxide film. The wafers brought into close contact with one another are subjected to a delamination heat treatment to delaminate the bond wafer at the ion-implanted layer, and thereby a bonded wafer is manufactured. The bonded wafer is thereafter subjected to a bonding heat treatment to firmly bond the SOI layer delaminated from the bond wafer to the base wafer, and thereby the SOI wafer is obtained (See Patent Literature 1).

In this case, the temperature of the delamination heat treatment (usually 500° C. or more) is generally lower than that of the subsequent bonding heat treatment for enhancing bonding strength sufficiently. The bond wafer is delaminated due to the delamination heat treatment before sufficiently enhancing the bonding strength. After the delamination, the thickness of silicon is thin, and the physical resistance is therefore low. In case of low bonding strength, for example, the SOI layer flakes off and is easily damaged, and the defects thereof are thus generated.

In the event that, before the delamination is caused, the bonding strength can be enhanced to the extent that the flaking is not generated, however, sufficient bonding strength can be effected in the subsequent bonding heat treatment, and a high quality SOI wafer having few defects can be thereby manufactured.

Conventionally, for the purpose of improving the bonding strength and reducing the defects, Patent Literature 2 describes that a pre-annealing is performed at a temperature of 200 to 400° C. (for 10 to 360 minutes), and thereafter the delamination is performed by a heat treatment at a temperature of 500° C. Patent Literature 3 describes that the temperature is increased after introduction at 350° C. and a heat treatment is thereafter performed at a temperature of 500° C. for the delamination. Patent Literature 4 describes that the temperature is increased after introduction at 300° C. and heat treatment is thereafter performed at a temperature of 500° C. for the delamination.

However, even when the pre-annealing is performed before the delamination heat treatment as described above, an incidence of the SOI layer defects, such as blisters (portions where the SOI layer is not bonded to the base wafer) or voids (portions where the SOI layer is not formed), cannot be sufficiently reduced in some cases.

CITATION LIST

Patent Literature

Patent Literature 1: Japanese Unexamined Patent publication (Kokai) No. H05-211128
Patent Literature 2: Japanese Unexamined Patent publication (Kokai) No. 2006-74034
Patent Literature 3: Japanese Unexamined Patent publication (Kokai) No. 2003-347176
Patent Literature 4: International Publication WO2005/024916

SUMMARY OF INVENTION

The present invention was accomplished in view of the above-explained circumstances, and its object is to provide a method for manufacturing a high quality bonded wafer by forming a high bonding strength state at a lower temperature than the temperature at which the delamination is caused and reducing the generation of the defects in the delamination process, in the manufacture of the bonded wafer by the Smart Cut method (registered trademark).

To achieve this object, the present invention provides a method for manufacturing a bonded wafer including at least the steps of: implanting at least one gas ion of a hydrogen ion and a rare gas ion into a silicon single crystal bond wafer from a surface thereof to form an ion-implanted layer inside the wafer; bringing the ion-implanted surface of the bond wafer into close contact with a surface of a base wafer directly or through a silicon oxide film; and performing heat treatment for delaminating the bond wafer at the ion-implanted layer, wherein the heat treatment step for delaminating includes performing a pre-annealing at a temperature of less than 500° C. and thereafter performing a delamination heat treatment at a temperature of 500° C. or more, and the pre-annealing is performed at least by a heat treatment at a first temperature and a subsequent heat treatment at a second temperature higher than the first temperature.

In this manner, when the pre-annealing is performed at a temperature of less than 500° C. at least by the heat treatment at the first temperature and the subsequent heat treatment at the second temperature higher than the first temperature and thereafter the delamination heat treatment is performed at the temperature of 500° C. or more, the bonding strength can be enhanced at a lower temperature than the temperature at which the delamination is caused, the voids and the blisters can be thereby reduced, and the bonded wafer having few defects can be consequently manufactured.

Moreover, the heat treatment at the first temperature in the pre-annealing is preferably performed at a temperature of 200±20° C.

In this manner, when the first temperature in the pre-annealing is nearly 200° C., water adhered to a bonded interface is sufficiently slowly desorbed, and the voids and the blisters can be thereby suppressed.

Moreover, the heat treatment at the second temperature in the pre-annealing is preferably performed at a temperature of 350±20° C.

In this manner, when the second temperature in the pre-annealing is nearly 350° C., the diffusion of ion-implanted hydrogen atoms can be suppressed, and the delamination can be fully performed in the subsequent delamination heat treatment.

With the method for manufacturing a bonded wafer according to the present invention, a high quality bonded wafer (including an SOI wafer and a directly bonded wafer) can be manufactured by forming a high bonding strength state at a lower temperature than the temperature at which the delamination is caused and reducing the generation of the defects generated in the delamination process, such as the voids and the blisters.

BRIEF DESCRIPTION OF THE DRAWINGS

FIG. 1 shows the analysis result of a desorption gas from the bonded interface based on TDS.

DESCRIPTION OF EMBODIMENTS

Hereinafter, the present invention will be explained in detail.

As described above, there has been conventionally the following problems. Since the temperature of the delamination heat treatment is lower than that of the bonding heat treatment for enhancing the bonding strength sufficiently, the delamination is caused before sufficiently enhancing the bonding strength. In addition, since the thickness of silicon is thin after the delamination, the physical resistance thereof is low. In case of low bonding strength, for example, the SOI layer is flaked off and is easily damaged, and the defects thereof are thus generated. The directly bonded wafer that is directly bonded without through an oxide film and is manufactured by the Smart Cut method also has the same problems. Hereinafter, an example of manufacturing the SOI wafer as the bonded wafer will be explained. The present invention can be properly applied to the directly bonded wafer.

In view of the above-described problems, the present inventors have conducted studies as follows. First, the present inventors have examined a phenomenon that takes place during the heat treatment at a lower temperature than the temperature at which the delamination is caused (a delamination temperature) in the delamination heat treatment.

There exists water ($H_2O$) at the bonded interface before the start of the delamination heat treatment. The water at the bonded interface is desorbed and diffused outside along the bonded interface during the heat treatment. It is difficult to measure a desorption rate and a diffusion rate practically. Conceptually, when the diffusion rate is higher than the desorption rate, a gas generated by the desorption is diffused without remaining at the bonded interface, and the bonding is maintained. On the other hand, when the desorption rate is higher than the diffusion rate, the gas generated by the desorption remains at the bonded interface to form a mass. That is, when the heat treatment is performed at the temperature at which the desorption of the adhered water ($H_2O$) is accelerated, a portion where the bonding is not formed, called a blister or a void, is formed. The present inventors therefore conceived that the pre-annealing is desirably performed at a low temperature at which the desorption of water sufficiently slowly proceeds, when paying attention to the desorption of water.

Moreover, the present inventors conceived the following. When the water at the bonded interface is desorbed, a bonding state of each Si at the bonded interface changes to form the bonding thereat. As temperature is higher, the bonding state is more apt to accelerate, and the bonding strength is thereby improved. The pre-annealing is accordingly desirably performed at a temperature as high as possible, when paying attention to the bonding state of each Si. In the event that implanted hydrogen starts moving due to an increase in temperature, however, the concentration of the implanted hydrogen decreases due to diffusion, and the delamination is not caused even when the temperature increases up to a delamination temperature later. The pre-annealing is accordingly desirably performed at a higher temperature in the temperature range in which the implanted hydrogen is not rapidly diffused, when paying attention to the diffusion of the implanted hydrogen.

In view of this, the present inventors have repeatedly keenly conducted studies and found that the enhancement of the bonding strength before reaching the delamination temperature can be achieved by performing the delamination heat treatment at the delamination temperature after performing the pre-annealing in which at least a heat treatment is performed at the first temperature that is as high as possible within the temperature range enabling the water at the bonded interface to be eliminated (desorbed) sufficiently and slowly and thereafter a heat treatment is performed at the second temperature that is higher than the first temperature and is as high as possible within the temperature range enabling the completion of sufficient desorption of water and little diffusion of the implanted hydrogen.

FIG. 1 shows the analysis result of a desorption gas from the bonded interface based on TDS (thermal desorption spectrometry). A desorption peak of water ($H_2O$) is shown between 200° C. and 350° C. A desorption peak of hydrogen ($H_2$) is also shown between the same temperatures as above, and this can be considered to be a peak caused by the desorption of water. In addition, another desorption peak of hydrogen ($H_2$) is shown between 350° C. and 450° C., and this can be considered to be a peak caused by the diffusion of implanted hydrogen atoms.

The present inventors have found the following from the above-described analysis result of the desorption gas based on TDS. The first temperature in the pre-annealing including at least a heat treatment at the first temperature and a heat treatment at the second temperature is a low temperature to be set to sufficiently slowly eliminate (desorb) the water at the bonding interface, and the first temperature is preferably nearly 200° C. (approximately 200° C.±20° C.) that is lower than the temperature corresponding to the desorption peak of water between 200° C. and 350° C. in FIG. 1 and is as high as possible. The second temperature, which is as high as possible within the temperature range enabling the completion of sufficient desorption of water and little diffusion of the implanted hydrogen, is preferably nearly 350° C. (approximately 350° C.±20° C.) that is higher than the temperature corresponding to the desorption peak of water between 200° C. and 350° C. and is lower than the temperature corresponding to the desorption peak of hydrogen between 350° C. and 450° C. in FIG. 1. The pre-annealing enables the bonding strength to be enhanced at a lower temperature than the temperature at which the delamination is caused. The formation of voids and the blisters can be thereby reduced, and an SOI wafer having few defects can be consequently manufactured.

Hereinafter, the present invention will be explained in more detail, but the present invention is not restricted thereto. Here, as preferred embodiment, the case of manufacturing an SOI wafer from two silicon wafers. The present invention can be also applied to the case of bonding an insulator substrate and a silicon wafer.

In the manufacture of the bonded wafer according to the present invention, the heat treatment step for delaminating the bond wafer includes performing the pre-annealing at a temperature of less than 500° C. and thereafter performing the delamination heat treatment at a temperature of 500° C. or more, and the pre-annealing is performed at least by a heat treatment at the first temperature and a subsequent heat treatment at the second temperature higher than the first temperature. The procedure from the preparation of wafers to the completion of the SOI wafer will be explained in turn.

First, a silicon single crystal base wafer adapted for device specifications as a supporting substrate and a silicon single crystal bond wafer that is party to be the SOI layer are prepared.

Next, the oxide film as an insulator film is formed on at least one of the base wafer and the bond wafer. The thickness of the oxide film and the like should be determined by the specifications and thus it is not restricted in particular. The oxide film having a thickness of approximately 0.01 to 2.0 μm may be formed by thermal oxidation.

Next, at least one gas ion of a hydrogen ion and a rare gas ion is implanted into the bond wafer from the surface thereof to form the ion-implanted layer inside the wafer. The ion-implanted surface of the bond wafer is thereafter brought into close contact with the surface of the base wafer through the above-described formed silicon oxide film.

Next, the pre-annealing is performing at a temperature of less than 500° C. The pre-annealing is performed at a temperature of less than 500° C. at least by performing the heat treatment at the first temperature and the subsequent heat treatment at the second temperature higher than the first temperature. The first temperature is a low temperature of 100° C. or more at which the water at the bonding interface can be sufficiently slowly eliminated and is preferably nearly 200° C. (200° C.±20° C.), which is as high as possible within the low temperature range so as to accelerate the bonding state at the bonding interface. The heat treatment at the second temperature higher than the first temperature is thereafter performed. The second temperature is preferably nearly 350° C. (350° C.±20° C.), which is as high as possible within the temperature range enabling the completion of sufficient desorption of water and little diffusion of the implanted hydrogen.

Moreover, the pre-annealing of the present invention is not restricted to the above-described heat treatment at the first and second temperature as long as the temperature is in the range of less than 500° C. The pre-annealing may be the heat treatment in which the temperature is increased in a multistage manner that has three stages or more including the heat treatment performed at another temperature, such as third temperature, fourth temperature, and the like, or may be a ramp-up annealing.

After the above-described pre-annealing, the temperature is increased to 500° C. or more, which enables the delamination at the ion implanted layer, to perform the delamination heat treatment, and the bond wafer is delaminated at the ion implanted layer so that the SOI wafer is obtained.

As described above, when the multistage pre-annealing is performed at a temperature of less than 500° C. and thereafter the delamination heat treatment is performed at a temperature of 500° C. or more as the heat treatment step for delaminating, the bonding strength can be enhanced at a lower temperature than the temperature at which the delamination is caused, the voids and the blisters can be thereby reduced, and the SOI wafer having few defects can be consequently manufactured.

EXAMPLE

Hereinafter, the present invention will be explained in more detail with reference to Examples and Comparative Examples, but the present invention is not restricted thereto.

Example 1

There were prepared 300 silicon single crystal wafers having a diameter of 300 mm. The prepared wafers were divided into the bond wafers and the base wafers. The thermal oxide film having a thickness of 150 nm was formed on the surface of each of the bond wafers. Then, hydrogen ions were implanted inside each of the bond wafers through the thermal oxide film (an implantation energy of 46 keV, and a dose amount of $5 \times 10^{16}/cm^2$).

The bond wafers were thereafter bonded to the base wafers at a room temperature each, and the heat treatment was performed to delaminate each of the bond wafers. At this point, the heat treatment conditions included the pre-annealing having the heat treatments at the first temperature and second temperature. The heat treatment at the first temperature in the pre-annealing was performed at a temperature of 200° C. for 4 hours, and the heat treatment at the second temperature in the pre-annealing was performed at a temperature of 350° C. for 2 hours. The temperature was thereafter increased to 500° C. and kept for 30 minutes to delaminate each of the bond wafers.

The surface of each of the bonded wafers (the SOI wafers) after the delamination was visually observed to obtain blister and void incidences. As a result, the blister and void incidences were 15.3% and 1.3% respectively. It is to be noted that the definitions of the blister and void incidences are as follows.

Blister incidence: (the number of wafers having blisters)/(the number of all wafers)×100(%)

Void incidence: (the number of wafers having voids)/(the number of all wafers)×100(%)

Comparative Example 1

Bonded wafers (SOI wafers) were manufactured in the same conditions as Example 1 except that a pre-annealing in a heat treatment process was performed only in one stage at a temperature of 350° C. for 2 hours. In this point, the obtained blister and void incidences were 24.0% and 76.0% respectively.

Example 2

There were prepared 300 silicon single crystal wafers having a diameter of 300 mm. The prepared wafers were divided into the bond wafers and the base wafers. The thermal oxide film having a thickness of 20 nm was formed on the surface of each of the bond wafers. Then, hydrogen ions were implanted inside each of the bond wafers through the thermal oxide film (an implantation energy of 35 keV, and a dose amount of $5 \times 10^{16}/cm^2$).

The bonding interface of the bond wafers were thereafter subjected to nitrogen plasma treatment for enhancing the bonding strength at a room temperature. Then, the bond wafers were bonded to the base wafers at a room temperature each, and the heat treatment was performed to delaminate each of the bond wafers. At this point, the heat treatment conditions included the pre-annealing having the heat treatments at the first temperature and second temperature. The heat treatment at the first temperature in the pre-annealing was performed at a temperature of 200° C. for 4 hours, and the heat treatment at the second temperature in the pre-annealing was performed at a temperature of 350° C. for 2 hours. The temperature was thereafter increased to 500° C. and kept for 30 minutes to delaminate each of the bond wafers.

Each of the bonded wafers (the SOI wafers) after the delamination was subjected to a heat treatment for flattening an SOI surface at a high temperature of 1200° C. so that SOI wafer products were completed.

The SOI wafer products were inspected with an optical surface inspection apparatus (SP2: made by KLA-Tencor Co., Ltd.) to obtain the number of defects having a size of 0.25 μm or more. As a result, an average number was 1.2 per wafer.

It is to be noted that most of the defects were caused by the blister, according to separately performed SEM observation of the defects having a size of 0.25 μm or more detected on the surfaces of the SOI wafer products.

Comparative Example 2

Bonded wafers (SOI wafers) were manufactured in the same conditions as Example 2 except that a pre-annealing in a heat treatment process was performed only in one stage at a temperature of 200° C. for 4 hours. The number of defects having a size of 0.25 μm or more was obtained as with Example 2. As a result, an average number was 2.3 per wafer.

Comparative Example 3

Bonded wafers (SOI wafers) were manufactured in the same conditions as Example 2 except that a pre-annealing in a heat treatment process was performed only in one stage at a temperature of 350° C. for 2 hours. The number of defects having a size of 0.25 m or more was obtained as with Example 2. As a result, an average number was 3.4 per wafer.

As described above, the method for manufacturing a bonded wafer according to the present invention enables the delamination after enhancing the bonding strength by surely eliminating water and the like, the reduction of the formation of the voids and blisters, and the manufacture of the SOI wafer having few defects.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for manufacturing a bonded wafer including at least the steps of:

implanting at least one gas ion of a hydrogen ion and a rare gas ion into a silicon single crystal bond wafer from a surface thereof to form an ion-implanted layer inside the wafer;

bringing the ion-implanted surface of the bond wafer into close contact with a surface of a base wafer directly or through a silicon oxide film; and performing heat treatment for delaminating the bond wafer at the ion-implanted layer, wherein:

the heat treatment step for delaminating includes performing a pre-annealing at a temperature of less than 500° C. and thereafter performing a delamination heat treatment at a temperature of 500° C. or more, and the pre-annealing comprises:

preforming a heat treatment at a first predetermined temperature of 200±20° C. and maintaining the first predetermined temperature; and subsequently performing a heat treatment at a second predetermined temperature of 350±20° C. and maintaining the second predetermined temperature.

* * * * *